(12) United States Patent
Lee et al.

(10) Patent No.: US 7,595,947 B2
(45) Date of Patent: Sep. 29, 2009

(54) LENS DRIVING DEVICE

(75) Inventors: Dong Kyun Lee, Seoul (KR); Byung Woo Kang, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 42 days.

(21) Appl. No.: 11/905,146

(22) Filed: Sep. 27, 2007

(65) Prior Publication Data

US 2008/0084620 A1   Apr. 10, 2008

(30) Foreign Application Priority Data

Sep. 27, 2006   (KR) .............. 10-2006-0094351

(51) Int. Cl.
*G02B 7/02*   (2006.01)
(52) U.S. Cl. .............. 359/824; 310/323.01; 310/323.17
(58) Field of Classification Search ................. 359/824; 310/323.01, 323.02, 323.06, 323.11, 323.15, 310/323.17
See application file for complete search history.

(56) References Cited

U.S. PATENT DOCUMENTS 7,265,480 B2 *   9/2007   Sasaki .................. 310/323.01

| 2002/0030422 A1 | 3/2002 | Hata |
| 2005/0029876 A1 | 2/2005 | Sasaki et al. |
| 2005/0062346 A1 | 3/2005 | Sasaki |
| 2005/0067922 A1 * | 3/2005 | Sasaki et al. ........... 310/323.09 |

FOREIGN PATENT DOCUMENTS

| CN | 1118016 | 3/1996 |
| JP | 10-90584 | 4/1998 |
| JP | 2005-99549 | 4/2005 |

OTHER PUBLICATIONS

Chinese Office Action issued on Oct. 17, 2008 in corresponding Chinese Patent Application No. 200710152019.8.

* cited by examiner

*Primary Examiner*—Joseph Martinez
(74) *Attorney, Agent, or Firm*—Staas & Halsey LLP

(57) ABSTRACT

A lens driving device including: a lens barrel having at least one lens therein; an actuator having a tip friction member provided at a leading end of a body thereof to be in contact with a friction member of the lens barrel, the actuator being flexed and bent upon application of power to provide a driving force necessary for driving the lens barrel in an optical axis direction; a preload member compressing the actuator against the lens barrel to keep the friction member and the tip friction member in contact with each other; and a guiding part guiding the lens barrel to move in the optical axis direction, wherein the friction member and the tip friction member are formed of a super-hard alloy.

7 Claims, 7 Drawing Sheets

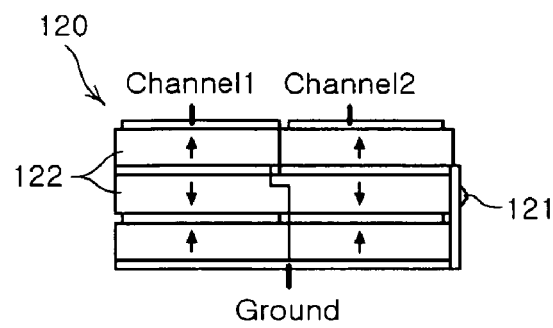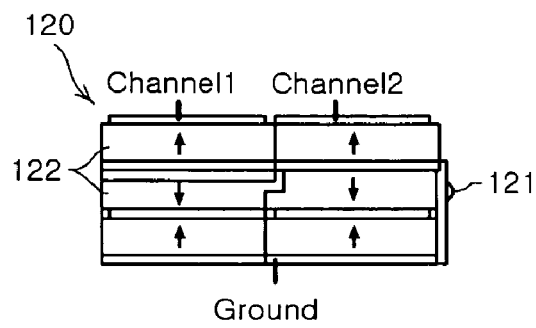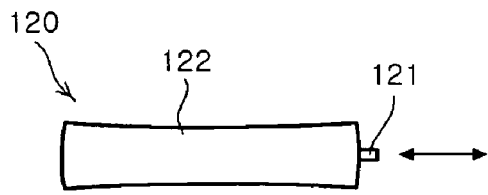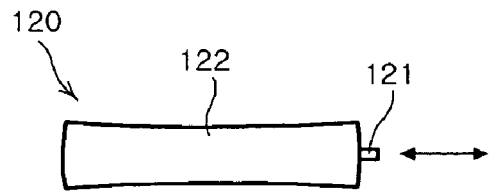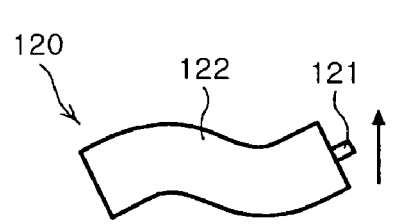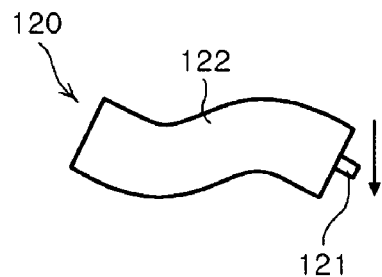
FIG. 7A FIG. 7B

LENS DRIVING DEVICE

CROSS-REFERENCE TO RELATED APPLICATIONS

This application claims the priority of Korean Patent Application No. 2006-94351 filed on Sep. 27, 2006, in the Korean Intellectual Property Office, the disclosure of which is incorporated herein by reference.

BACKGROUND OF THE INVENTION

1. Field of the Invention

The present invention relates to a lens driving device employed in an optical apparatus, more particularly, which, during frictional driving, generates a friction force necessary for driving a lens, with predetermined hardness maintained, but suffers minimal abrasion, thereby achieving stable operation properties and higher driving properties.

2. Description of the Related Art

In general, an optical apparatus includes a lens driving device for driving a lens using a cam structure, a screw or a piezoelectric element. The lens driving device employs a motor or the piezoelectric element to generate a driving force and the cam structure or the screw to transmit the driving force.

Therefore, the lens driving device drives the lens to change a relative distance of the lens, thereby performing zooming or focusing.

Meanwhile, the lens driving device utilized in a mega-pixel mobile phone chiefly adopts as a driving force a stepper motor, a voice coil motor (VCM), and a piezoelectric ultrasonic motor. The piezoelectric ultrasonic motor changes simple vibration such as shrinkage and expansion caused upon application of power to a piezoelectric body into circular or linear vibration due to friction between stators or rotors.

Thus the piezoelectric ultrasonic motor exhibits higher energy density, a quicker response rate and a higher location precision than an electromagnetic motor, also noise-free and not susceptible to electromagnetic waves.

U.S Patent Publication No. 2005-29876 and U.S Patent Publication No. 2005-62346 disclose a lens driving device including a vibrator composed of a body having piezoelectric sheets stacked therein, a guide shaft in contact with a driving contacting part disposed on top and bottom of the body, and a compressor generating a compression force between the driving contacting part and the guide shaft. In this lens driving device, the body is moved back and forth using ultrasonic vibration occurring in response to power applied to the body.

Accordingly, when two alternating current signals with a 90 degree phase difference are applied to the body of the vibrator, the body vibrates in both length and bending directions. Then a friction force between the driving contacting part and the guide shaft in contact with each other by the compressor is generated to move back and forth the body along the guide shaft.

Also, the driving contacting part in contact with the guide shaft is formed of a resin having abrasive particles such as alumina powder dispersed and solidified therein to achieve hardness and flexibility.

However, when the vibrator runs for long time, the friction force between the guide shaft and the driving contacting part causes the driving contacting part having a very rough surface to be abraded even though the driving contacting part is formed of a high-hardness material such as alumina ceramics $AlO_2$ or silicon carbide SiC. Accordingly, foreign dusts from abrasion may infiltrate into sensitive parts to degrade characteristics of the device.

SUMMARY OF THE INVENTION

An aspect of the present invention provides a lens driving device which, during frictional driving, generates a sufficient friction force necessary for driving a lens, with predetermined hardness maintained, while suffering minimal abrasion even during long operation, thereby achieving stable operation characteristics and higher driving characteristics.

According to an aspect of the present invention, there is provided a lens driving device including: a lens barrel having at least one lens therein; an actuator having a tip friction member provided at a leading end of a body thereof to be in contact with a friction member of the lens barrel, the actuator being flexed and bent in response to application of power to provide a driving force necessary for driving the lens barrel in an optical axis direction; a preload member compressing the actuator against the lens barrel to keep the friction member and the tip friction member in contact with each other; and a guiding part guiding the lens barrel to move in the optical axis direction, wherein the friction member and the tip friction member are formed of a super-hard alloy.

The tip friction member and the friction member may be formed of a super-hard alloy having a hardness knoop of 1000 to 2000 $kg/mm^2$.

The lens barrel may include a lens holder having an inner space for housing at least one lens along an optical axis, and an extension part vertically extended in a certain length to face the tip friction member and provided with the friction member to be in contact with the tip friction member.

The actuator may be a piezoelectric ultrasonic motor where the body has a plurality of piezoelectric sheets stacked.

The preload member may be a plate spring provided at one side thereof with a free end in contact with a rear end of the body and at another side thereof with a fixed end fixed to one of a lower base having the lens barrel mounted thereon and an upper case covering the lens barrel, thereby elastically supporting the actuator against the friction member.

The guiding part may include a first guide rod vertically disposed in a certain length by a bearing member formed on a first guide surface of the extension part extended from the lens barrel, and a second guide rod disposed in a certain length on a second guide surface of the extension part.

BRIEF DESCRIPTION OF THE DRAWINGS

The above and other aspects, features and other advantages of the present invention will be more clearly understood from the following detailed description taken in conjunction with the accompanying drawings, in which:

FIGS. 5A and 5B illustrate a bearing member disposed in a lens driving device according to an exemplary embodiment of the invention, in which FIG. 5A is a perspective view and FIG. 5B is a longitudinal cross-sectional view;

FIGS. 6A through 6C illustrate an actuator employed in a lens driving device according to an exemplary embodiment of the invention, in which FIG. 6A is a view illustrating a piezoelectric body flexed in a length direction, FIG. 6B is a view illustrating a piezoelectric body bent in a height direction, and FIG. 6C is a front view illustrating a piezoelectric body flexed and bent as well;

FIGS. 7A and 7B are conceptual views illustrating internal and external electrodes of an actuator employed in a lens driving device and vibration modes according to an exemplary embodiment.

DETAILED DESCRIPTION OF THE PREFERRED EMBODIMENT

Exemplary embodiments of the present invention will now be described in detail with reference to the accompanying drawings.

Figure 1:
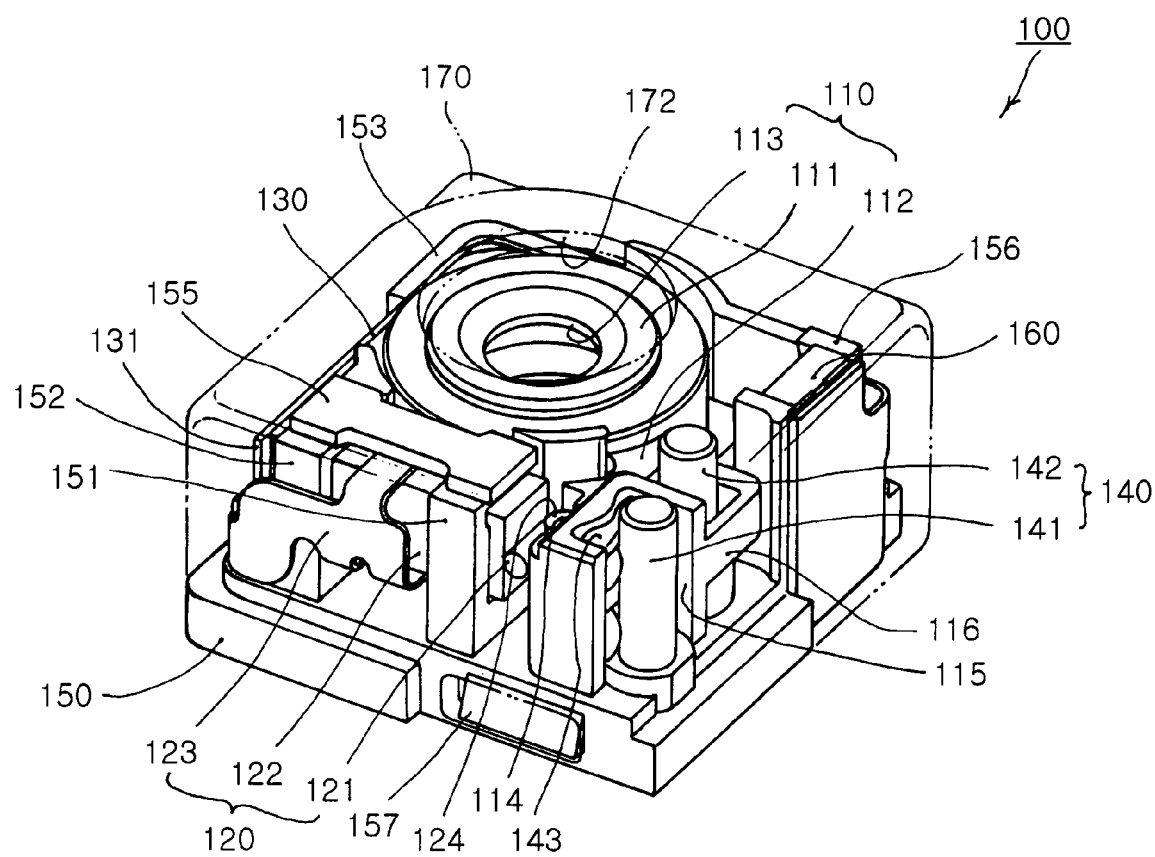
FIG. 1 is an overall perspective view illustrating a lens driving device according to an exemplary embodiment of the invention.
Figure 2:
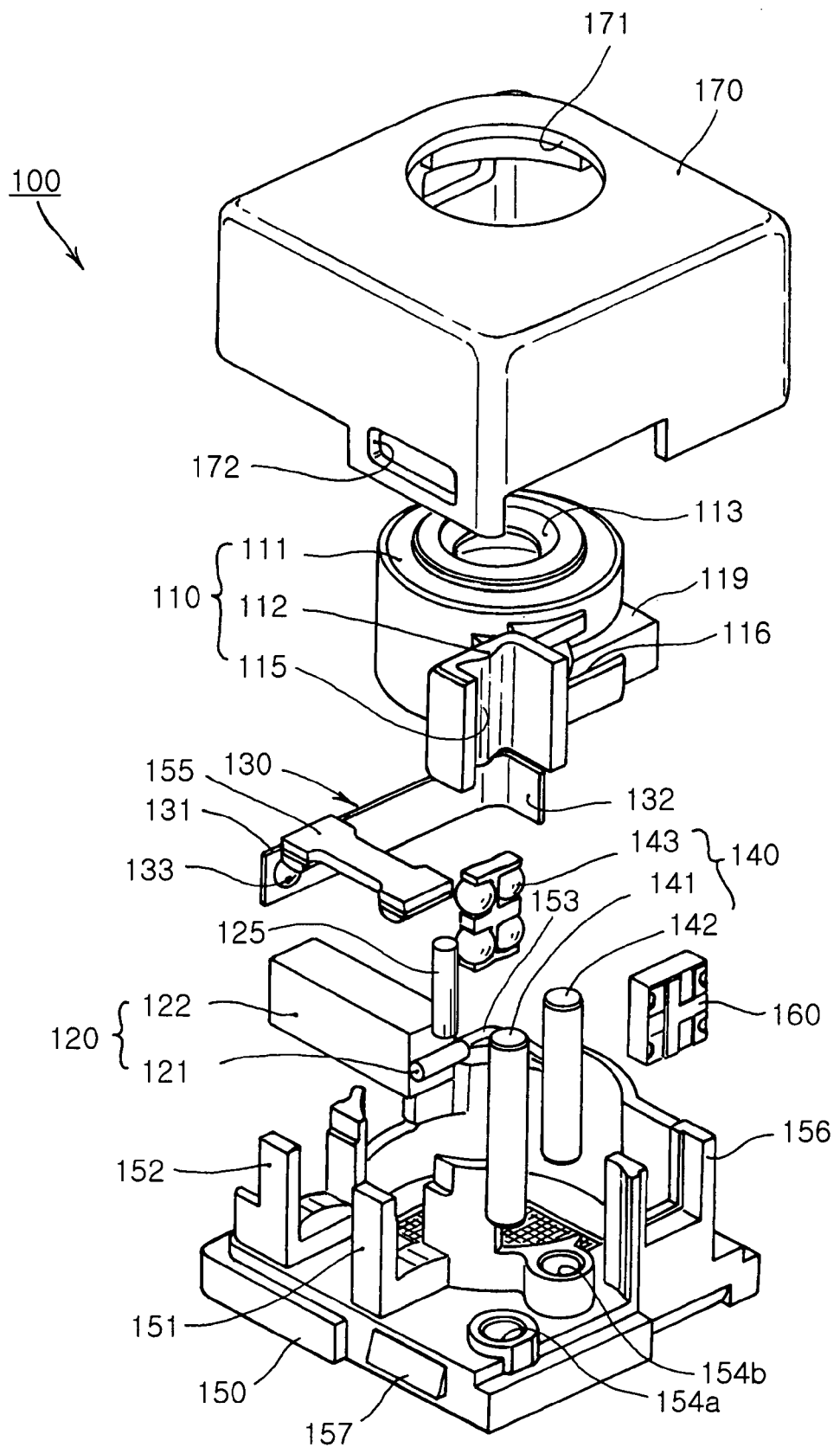
FIG. 2 is an exploded perspective view illustrating a lens driving device according to an exemplary embodiment of the invention.

FIG. 1 is an overall perspective view illustrating a lens driving device and FIG. 2 is an exploded perspective view illustrating a lens driving device according to an exemplary embodiment of the invention.

The lens driving device 100 of the present embodiment includes a lens barrel 110, an actuator 120, a preload member and a guiding part 140 as shown in FIGS. 1 and 2.

Lens Barrel

The lens barrel 110 is formed by injection molding to have a lens holder 111 and an extension part 112, and the lens holder 111 is formed in a hollow cylindrical shape to have an inner space of a certain size for housing at least one lens along an optical axis.

The extension part 112 is extended in a certain length from an outer surface of the lens holder 111 toward a tip friction member 121 to face the tip friction member 121 disposed in a leading end of the actuator 120.

This extension part 112 includes a vertical surface 114 and a first guide surface 115. A fixing groove 114a is recessed in the vertical surface 114 to fix a friction member 125 generating a friction force in contact with the tip friction member 121 thereon. A bearing member 143 is disposed on the first guide surface 115.

A guide groove 115a is formed on the first guide surface 115 in an optical axis direction to have a ball member 143a constituting the bearing member 143 disposed thereon.

Also, a second guide surface 116 is provided between the lens holder 111 and the extension part 112 to have a second guide rod 142 of the guiding part 140 disposed thereon.

Here, the vertical surface 114 is provided at one side of the extension part 112 facing the tip friction member 112 of the actuator 120 and the first guide surface 115 is provided at another opposite side of the extension part 112.

Meanwhile, the extension part 112 constituting the lens barrel 110 may be integrally formed with the lens holder 111 when the lens barrel 110 is injection molded, but not limited thereto. The extension part 112 may be separately injection molded to be engagingly assembled to the hollow cylindrical shaped lens holder 111 injection molded.

A light hole 113 with a certain size is perforated in a top of the lens holder 111 to have a center thereof aligned with the optical axis of the lens.

Actuator

The actuator 120 is a rectangular parallelepiped piezoelectric ultrasonic motor composed of the tip friction member 121 and a body 122 formed at the leading end thereof to be integral with the tip friction member 121.

The tip friction member 121 is formed at a leading end of the body 122 to generate a friction force in corresponding contact with the friction member 125 provided on the vertical surface 114. Also, the tip friction member 121 is formed to face the vertical surface 114, i.e., one side of the extension part 112 extended from the lens barrel 110.

The body 122 has a plurality of electrode terminals provided on an outer surface thereof to be connected to an external power via a power cable 123. In response to power applied through the electrode terminals, the body 122, which is composed of a plurality of stacked piezoelectric sheets each having particular internal electrodes, produces a flexural mode in a length direction and a bending mode in a thickness direction.

The actuator 120 is inserted down into a pair of vertical ribs 151 and 152 so that opposed sides of the body 122 are held by the vertical ribs 151 and 152 which vertically extend in a certain length from a top of a lower base 150 where the lens barrel 110 is mounted.

A fixed plate 155 is disposed above the pair of vertical ribs 151 and 152 to contact a top of the body 122, thereby preventing disengagement and play of the actuator 120.

Accordingly, the actuator 120, when inserted into the vertical ribs 151 and 152, is prevented from side to side play. Thus, the actuator 120 transfers the driving force generated upon application of power to the lens barrel 110 via the friction member 125 contacting the tip friction member 121.

Figure 3:
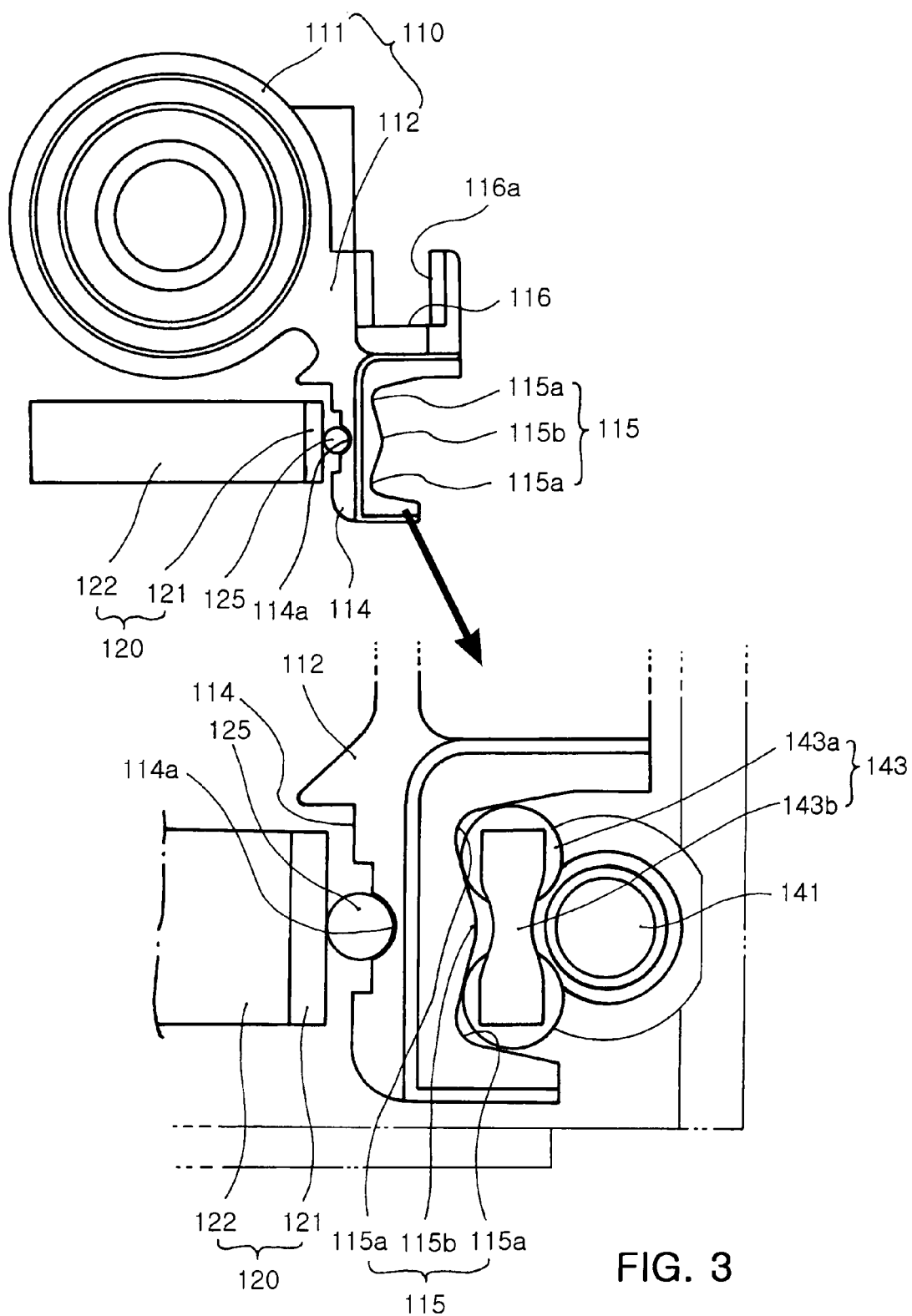
FIG. 3 is a detailed view illustrating contact status between a lens barrel and an actuator employed in a lens driving device according to an exemplary embodiment of the invention.
Figure 4:
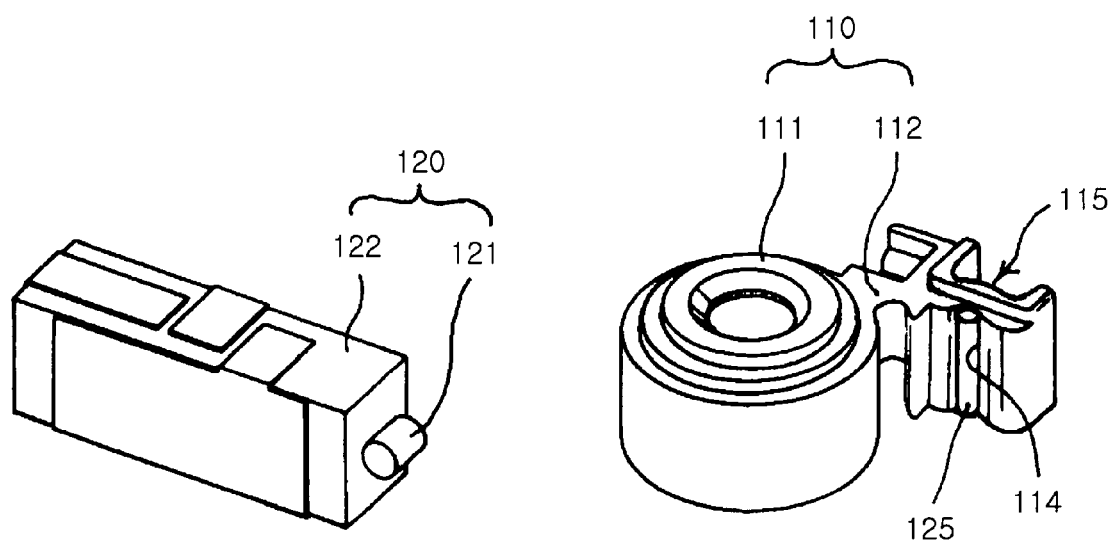
FIG. 4 is an exploded perspective view for explaining contact status between a lens barrel and an actuator employed in a lens driving device according to an exemplary embodiment of the invention.

FIG. 3 is a detailed view illustrating contact status between a lens barrel and an actuator employed in a lens driving device according to an exemplary embodiment of the invention. FIG. 4 is an exploded view for explaining contact status between a lens barrel and an actuator employed in a lens driving device according to an exemplary embodiment of the invention. As shown, a tip friction member 121 formed at a leading end of a body 122 of the actuator 120 and a friction member 125 formed on an extension part 112 of the lens barrel 110 cross perpendicularly to be in contact with each other.

The tip friction member 121 and the friction member 125 may be formed of a super-hard alloy friction material having a hardness knoop (HK) of 1000 to 2000 $kg/mm^2$, which ensures surface roughness for producing a sufficient friction force necessary for moving the lens barrel 110 in an optical axis direction and causing minimum abrasion during friction.

Here, both the tip friction member 121 and the friction member 125 may be formed of a super-hard alloy but not limited thereto. Alternatively, only one of the tip friction member 121 and the friction member 125 may be formed of a super-hard alloy friction material.

In order to bond the tip friction member 121 and the friction member 125 onto the leading end of the body 122 and the vertical surface 114 of the extension part 112, respectively, bonding locations are determined while a certain amount of pressure is applied using a separate jig (not shown). With pressure still applied, thermosetting resin is applied to bond the tip friction member 121 and the friction member 125 onto the leading end of the body 122 and the fixing groove 114a of the vertical surface 114, respectively, thereby formed integral with the actuator 120 and the lens barrel 110.

Meanwhile, the tip friction member 121 and the friction member 125 are of a cylindrical shape according to the present embodiment, but not limited thereto. The tip friction member 121 and the friction member 125 may be of any shape such as semi-circle and hexagon, which allows transfer of a friction force from one to the other side.

Preload Member

As shown in FIGS. 1 and 2, the preload member 130 is an elastomer of a leaf spring structure. The preload member 130 is provided at one side thereof with a free end 131 to be in contact with a rear end of the body 122 of the actuator 120, which is the opposite of the leading end where the tip friction member 121 is formed, thereby applying an elastic force of a certain magnitude to the extension part 112.

This preload member 130 is fixed by inserting a fixed end 132 provided at another side thereof into the fixing groove 153 of the lower base 150, however without being limited thereto. Alternatively, to fix the preload member 130, the fixed end 132 thereof may be inserted into a fixing groove of an upper case 170 disposed above the lower base 150.

The fixing groove optionally formed in one of the lower base 150 and the upper case 170 is integrally formed in an arbitrary location when the lower base 150 and the upper case 170 are injection molded.

The free end 131 of the preload member 130 has a protrusion 133 formed thereon to have a point contact with a rear end of the piezoelectric body 122 of the actuator 120, thereby allowing pressure to be applied to the actuator 120 more intensively.

The fixed end 132 of the preload member 130 is bent at a certain angle toward the lens barrel 110 to be fixed to one of the upper case 170 and the lower base 150.

Guiding Part

As shown in FIGS. 1 to 3, the guiding part 140 includes a first guide rod 141 and a second guide rod 142 for guiding movement of the lens barrel 110 when the lens barrel 110 is reciprocally moved back and forth in the optical axis direction by the driving force provided from the actuator 120.

The first guide rod 141 having a certain length is vertically disposed via a bearing member 143 brought in point contact therewith to minimize friction resistance when the first guide rod 141 moves in contact with the first guide surface 115 provided on another side of the extension part 112.

The first guide surface 115 includes a pair of guide grooves 115a in point contact with at least two portions of a ball member 143a constituting the bearing member 143, and a guide protrusion 115b formed between the guide grooves 115a.

Furthermore, a second guide rod 142 having a certain length is disposed on a second guide surface 116 provided at one side of the extension part 112, adjacent to the first guide surface 115.

The second guide surface 116 has pillars 116a with an arc-shaped cross-section formed on opposing inner surfaces to be in contact with an outer surface of the second guide rod 142.

Here, the second guide rod 142 provided on the second guide surface 116 is formed in a portion adjacent to the first guide rod 141 to prevent the lens barrel 110 from being rotated about the first guide rod 141 when the lens barrel 110 is guided to move by the driving force from the actuator 120.

The second guide rod 142 may be slidably assembled in a guide hole (not shown) additionally perforated in the lens barrel 110.

Here, the first and second guide rods 141 and 142 may have respective lower ends thereof inserted into the first and second fixed holes 154a and 154b formed in a top of the lower base 150 where the image sensor (not shown) is disposed, thereby vertically fixed in alignment with the optical axis, but not limited thereto. Alternatively, the first and second guide rods 141 and 142 may have respective upper ends thereof fixed to the upper case 170 provided with an opening 171 for exposing a lens of the lens barrel 110 and assembled with the lower base 150.

Figure 5A:
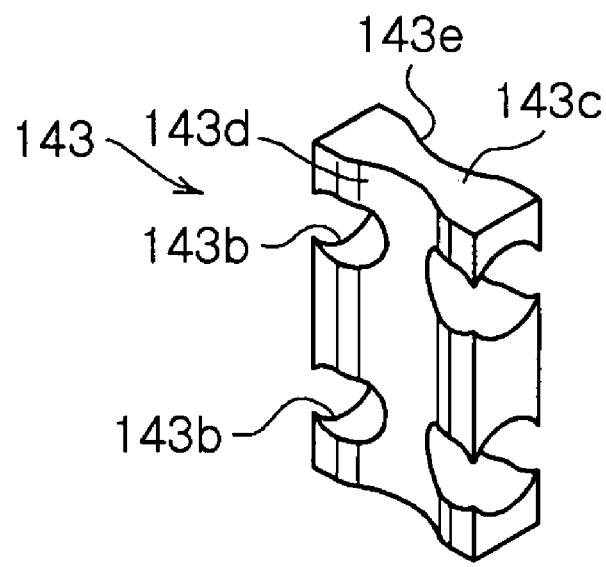
Figure 5B:
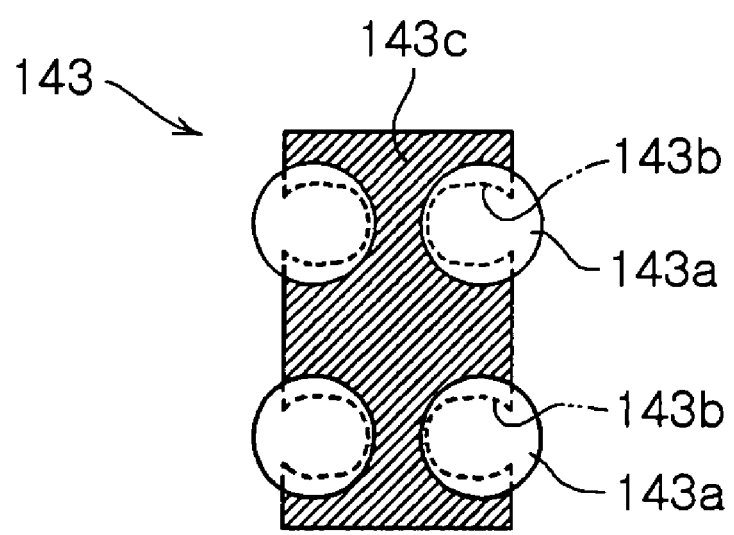

As shown in FIGS. 5A and 5B, the bearing member 143 disposed between the first guide surface 115 and the first guide rod 141 includes pairs of upper and lower balls 143a in point contacts with outer surfaces of the first guide surface 115 and the first guide rod 141, respectively, and a retainer 143c having a plurality of upper and lower ball grooves 143b in which the upper and lower balls 143a are rotatably disposed.

In front and back surfaces of the retainer 143c, groves 143d and 143e are recessed to prevent contact between the guide protrusion 115b protruded from the first guide surface 115 and the first guide rod 141.

Here, the upper and lower balls 143a and the first guide rod 141 may be disposed at positions corresponding to respective vertices of a triangle to stay in stable point contact with each other, thereby preventing misalignment.

Also, a center of the first guide rod 141 is flush with a virtual axis corresponding to a contact point between the tip friction member 121 of the actuator and the friction member 125 of the extension part. The contact point between the tip friction member 121 and the friction member 125 may be flush with a virtual axis corresponding to a contact point between the free end 131 of the preload member 130 and the actuator 120.

At the same time, the first guide rod 141 is assembled to the extension part 112 of the lens barrel 110 by the bearing member 143 in point contact with the first guide surface 115 of the extension part 112. Accordingly, the bearing member 143 disposed between the extension part 112 and the first guide rod 141 may be minimized in friction resistance when the lens barrel 110 is moved, thereby further reducing loss in the driving force.

Moreover, the second guide rod 141 assembled to the second guide surface 116 comes in point contact with the arc-shaped pillars 116a formed on the inner surfaces of the second guide surface 116, thereby contacting each other in a minimal area. This further minimizes friction loss occurring when the lens barrel 110 is guided to move.

Meanwhile, as shown in FIGS. 1 and 2, the lens driving device 100 of the present embodiment further includes a lower base 150 on which the lens barrel is mounted and an images sensor and a substrate, which are not illustrated, are disposed.

A sensor fixer 156 is disposed on the lower base 150 and a location sensor 160 is provided to the sensor fixer 156. An indicator 119 is provided on an outer surface of the lens barrel 110, and the location sensor 160 senses vertical movement of the indicator 119 to detect location change of the lens barrel 110.

A reflective film may be disposed on a surface of the indicator 119 to enhance reflectivity of light emitted from the location sensor 160.

The location sensor 160 is provided at one side thereof with a feeding terminal to which a power voltage is applied and a plurality of terminals through which signals are transmitted and received.

Also, an upper case 170 having an inner space of a certain size is disposed above the lower base 150 to protect the lens barrel 110, the actuator 120, the preload member 130 and the guiding part 140 from external environment.

The upper case 170 has a top surface provided with an opening 171 exposing a light hole 113 of the lens barrel 110 and an assembly hole 172 assembled with an assembly protrusion 157 protruded from an outer surface of the lower base 150.

Furthermore, a shield can may (not shown) be disposed on the upper case 170 to prevent outward radiation of harmful electromagnetic waves generated during operation of the actuator 120.

In the lens driving device 100 of the present embodiment, to reciprocally move the lens barrel 110 with at least one lens disposed therein in the optical axis direction, external power is applied via a power cable 123 connected to the actuator to effect longitudinal (flexural) and bending modes of vibration of the body 122 having piezoelectric layers stacked therein, thereby generating the driving force for moving the lens barrel 110.

Figure 6A:
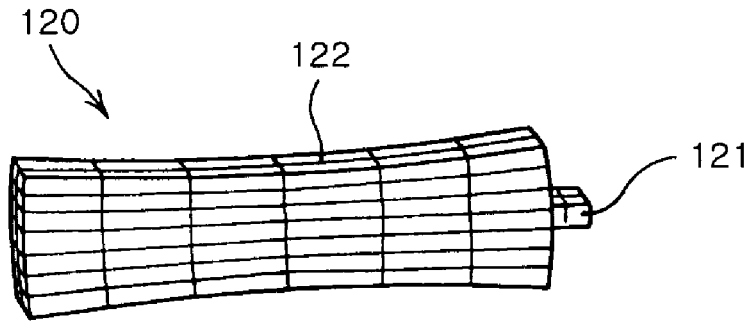
Figure 6B:
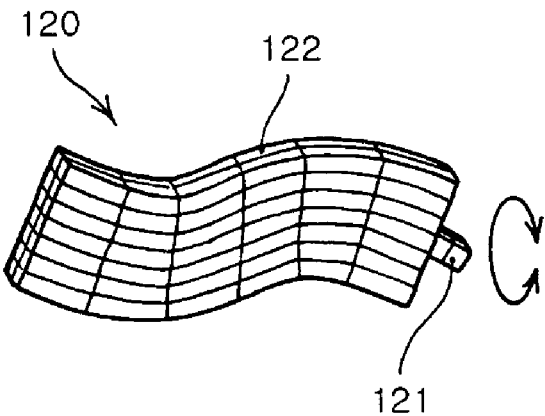
Figure 6C:
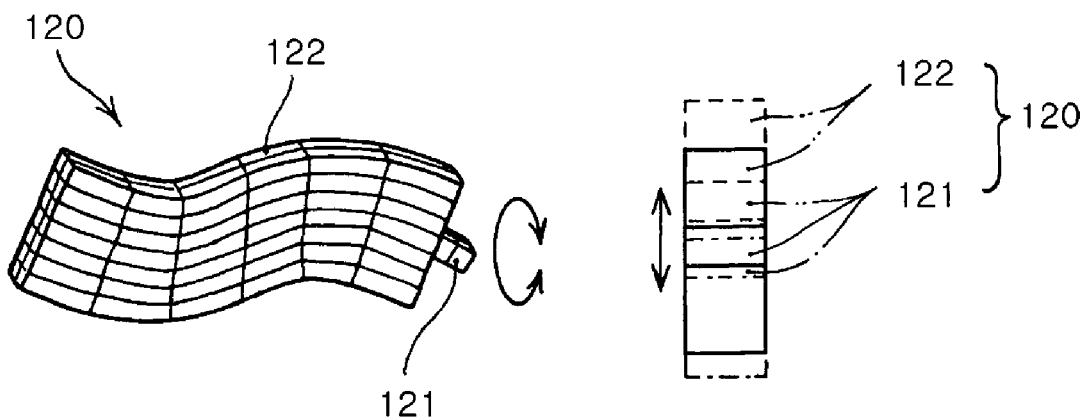

That is, as shown in FIGS. 6A, 6B and 6C, as the actuator 120 is driven by the longitudinal and bending modes at a resonant frequency of at least 20 kHz in an ultrasonic region, the tip friction member 121 attached to an end of the body 122 moves along an elliptical locus or path.

The direction of the elliptical locus movement is determined by resonant frequency ranges determined by internal and external electrodes of the body 12, and this in turn enables adjustment of the transport direction of the lens. The internal and external electrodes and the vibration modes are conceptually illustrated in FIGS. 7A and 7B.

That is, in response to selective power application through channel 1 or channel 2, the body 122 having a stack of multiple layers simultaneously performs the longitudinal (flexural) mode and the bending mode, and thus the tip friction member 121 provided at one end of the body 122 moves linearly in upward and downward directions.

Here, the actuator 120 is fixed to vertical ribs 151 and 152 of the lower base 150 to be prevented from horizontal movement. Thus, the tip friction member 121 makes only vertical, back-and-forth linear movement, and the direction of the vibration locus is adjusted upward or downward according to a direction of the power applied to the body 122.

In consequence, the tip friction member 121 moving only in a vibration locus of vertical direction conveys the driving force via the friction member 125 disposed on the extension part 112 of the lens barrel 110, which is the object of transport. Thus, the lens barrel 110 is elevated or lowered in the optical axis direction along the first and second guide rods 141 and 142 of the guiding part 140.

Here, a friction force generated between the tip friction member 121 and the friction member 125 is greater than a friction force generated between the first and second guide rods 141 and 142 and the lens barrel 110.

At least one of the tip friction member 121 and the friction member 125 is formed of a super-hard alloy friction material having a hardness knoop (HK) of 1000 to 2000 kg/mm$^2$. Accordingly, the tip friction member 121 and the friction member 125 generate a sufficient friction force necessary for moving the lens barrel 110 in an optical axis direction and are in smooth surface contact with each other. This as a result allows the lens barrel 110 to suffer minimal abrasion even during long-time frictional driving, thereby preventing decline in driving properties thereof due to foreign substances.

EXAMPLE

Table 2 below shows results after repeatedly operating an actuator 300,000 times, which employed the tip friction member 121 and the friction member 125 formed of high-strength friction materials of Table 1.

TABLE 1

| Friction material | Density (kg/mm$^3$) | Hardness (HK) | Fracture strength (GPa) | Tensile force | Remark |
|---|---|---|---|---|---|
| SiC | 3200 | 2480 kg/mm$^2$ | 0.1862 | 0.03448~0.1379 | |
| Al$_2$O$_3$ | 4000 | 2100 kg/mm$^2$ | 0.9034 | 0.2552~0.2607 | |
| Super-hard alloy | 15800 | 1875 kg/mm$^2$ | 0.3838~0.5793 | 0.3448 | |
| High speed steel | | 1250 kg/mm$^2$ | 0.4400 | 0.3800 | Corrosion |

TABLE 2

| | Tip friction member | Friction member | Comparison (after 300,000 frictional operations) |
|---|---|---|---|
| 1 | Al$_2$O$_3$ | Al$_2$O$_3$ | Degraded performance |
| 2 | Al$_2$O$_3$ | High-speed steel (SKH) | Excessive abrasion, great amount of dusts, noises |
| 3 | SiC | High-speed steel (SKH) | Excessive abrasion, great amount of dusts |
| 4 | Super-hardness alloy(WC) | Super-hardness steel (SKH) | Good performance, small amount of dusts |
| 5 | Super-hardness alloy(WC) | Super-hardness alloy (WC) | Good performance, small amount of dusts |

As noted in Table 2, when the tip friction member 121 and the friction member 125 were formed of a super-hardness alloy and a high-speed steel, or a super-hardness alloy and a super-hardness alloy, respectively, the actuator operated without any change in properties thereof even after a useful life test and suffered a considerably small amount of abrasion.

However, since the high-speed steel may cause corrosion which adversely affects driving properties of the actuator, the tip friction member 121 and the friction member 125 may not adopt the super-hardness alloy and the high-speed steel, respectively.

Meanwhile, vertical movement of the lens barrel 110 along the first and second guide rods 141 and 142 is detected by the location sensor 160 detecting the indicator 119 protruded from an outer surface of the lens barrel 110, and the vertical movement amount detected ensures adequate control of the driving force of the actuator 120 vertically transporting the lens barrel 110.

As set forth above, according to exemplary embodiments of the invention, a tip friction member and a friction member disposed in contact with each other between an actuator and a lens barrel to deliver a driving force are formed of a super-hardness alloy. Thus, during frictional driving, the tip friction member and the friction member are brought in smooth surface contact with each other, thereby generating a sufficient friction force for moving the lens barrel in an optical axis direction and also suffering minimal abrasion.

This ensures stable operating properties and better driving properties of a lens driving device.

While the present invention has been shown and described in connection with the exemplary embodiments, it will be apparent to those skilled in the art that modifications and variations can be made without departing from the spirit and scope of the invention as defined by the appended claims.

What is claimed is:

1. A lens driving device comprising:

a lens barrel having at least one lens therein;

an actuator having a tip friction member provided at a leading end of a body thereof to be in contact with and disposed perpendicular to a friction member provided on a vertical surface of an extension part extending from the lens barrel, the actuator being flexed and bent upon application of power to provide a driving force necessary for driving the lens barrel in an optical axis direction;

a preload member compressing the actuator against the lens barrel to keep the friction member and the tip friction member in contact with each other; and a guiding part guiding the lens barrel to move in the optical axis direction, wherein the friction member and the tip friction member are formed of a super-hard alloy.

2. The lens driving device of claim 1, wherein the tip friction member and the friction member are formed of a super-hard alloy having a hardness knoop of 1000 to 2000 kg/mm2.

3. The lens driving device of claim 1, wherein the lens barrel comprises a lens holder having an inner space for housing at least one lens along an optical axis.

4. The lens driving device of claim 1, wherein the actuator is a piezoelectric ultrasonic motor where the body has a plurality of piezoelectric sheets stacked.

5. The lens driving device of claim 1, wherein the preload member is a plate spring provided at one side thereof with a free end in contact with a rear end of the body and at another side thereof with a fixed end fixed to one of a lower base having the lens barrel mounted thereon and an upper case covering the lens barrel, thereby elastically supporting the actuator against the friction member.

6. The lens driving device of claim 1, wherein the guiding part comprises a first guide rod vertically disposed in a certain length by a bearing member formed on a first guide surface of the extension part extended from the lens barrel, and a second guide rod disposed in a certain length on a second guide surface of the extension part.

7. A lens driving device comprising:

a lens barrel having at least one lens therein; and an actuator having a tip friction member provided at a leading end of a body thereof to be in contact with and disposed perpendicular to a friction member provided on a vertical surface of an extension part extending from the lens barrel, the actuator providing a driving force necessary for driving the lens barrel in an optical axis direction.

* * * * *

UNITED STATES PATENT AND TRADEMARK OFFICE
CERTIFICATE OF CORRECTION

PATENT NO. : 7,595,947 B2
APPLICATION NO. : 11/905146
DATED : September 29, 2009
INVENTOR(S) : Dong Kyun Lee et al.

It is certified that error appears in the above-identified patent and that said Letters Patent is hereby corrected as shown below:

Column 9, Line 29, change "kg/mm2" to --kg/mm$^2$--.

Signed and Sealed this

Twenty-second Day of December, 2009

David J. Kappos
*Director of the United States Patent and Trademark Office*